(12) United States Patent
Liu et al.

(10) Patent No.: US 8,237,253 B2
(45) Date of Patent: Aug. 7, 2012

(54) PACKAGE STRUCTURES

(75) Inventors: Benson Liu, Taipei (TW); Hsien-Wei Chen, Sinying (TW); Shin-Puu Jeng, Hsinchu (TW); Hao-Yi Tsai, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 16 days.

(21) Appl. No.: 12/946,930

(22) Filed: Nov. 16, 2010

(65) Prior Publication Data

US 2011/0062597 A1   Mar. 17, 2011

Related U.S. Application Data

(62) Division of application No. 11/619,095, filed on Jan. 2, 2007, now Pat. No. 7,859,092.

(51) Int. Cl.
*H01L 25/07* (2006.01)

(52) U.S. Cl. . 257/686; 257/777; 257/684; 257/E25.018; 257/E33.07; 438/601; 438/107

(58) Field of Classification Search .................. 257/686, 257/777, 684, E25.018, E33.07; 438/601, 438/107
See application file for complete search history.

(56) References Cited

U.S. PATENT DOCUMENTS

| | | | |
|---|---|---|---|
| 3,142,047 A * | 7/1964 | Henderson | 365/51 |
| 4,868,634 A * | 9/1989 | Ishida et al. | 257/690 |
| 5,640,044 A | 6/1997 | Takehashi et al. | |
| 6,051,878 A * | 4/2000 | Akram et al. | 257/686 |
| 2003/0153123 A1 | 8/2003 | Tsai et al. | |
| 2004/0021230 A1 | 2/2004 | Tsai et al. | |
| 2006/0094222 A1 | 5/2006 | Wong et al. | |
| 2007/0057381 A1 | 3/2007 | Wong et al. | |

* cited by examiner

*Primary Examiner* — Cuong Q Nguyen
*Assistant Examiner* — Cathy N Lam
(74) *Attorney, Agent, or Firm* — Duane Morris LLP (57) ABSTRACT

A package structure includes a substrate, a first die and at least one second die. The substrate includes a first pair of parallel edges and a second pair of parallel edges. The first die is mounted over the substrate. The first die includes a third pair of parallel edges and a fourth pair of parallel edges, wherein the third pair of parallel edges and the fourth pair of parallel edges are not parallel to the first pair of parallel edges and the second pair of parallel edges, respectively. The at least one second die is mounted over the first die.

18 Claims, 8 Drawing Sheets

PACKAGE STRUCTURES

This application is a division of U.S. patent application Ser. No. 11/619,095, filed Jan. 2, 2007, which is expressly incorporated by reference herein in its entirety.

BACKGROUND OF THE INVENTION

1. Field of the Invention

The present invention relates to semiconductor structures, and more particularly to package structures.

2. Description of the Related Art

With advances associated with electronic products, semiconductor technology has been widely applied in manufacturing memories, central processing units (CPUs), liquid crystal displays (LCDs), light emission diodes (LEDs), laser diodes and other devices or chipsets. In order to achieve high-integration and high-speed goals, dimensions of semiconductor integrated circuits continue to shrink. In addition, various package techniques also have been proposed or provided to improve performances of integrated circuits.

Figure 1A:
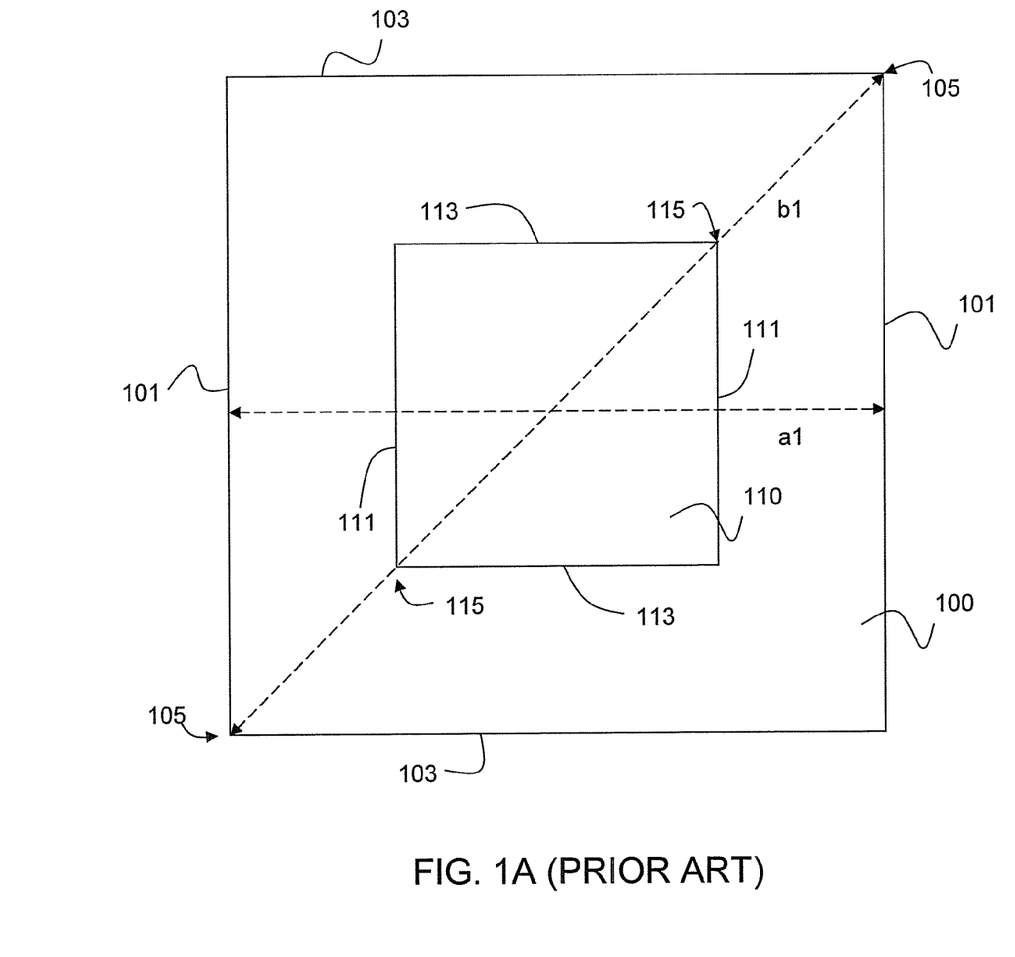
FIGS. 1A-1B are top views of prior art package structures.

FIG. 1A is a top view of a prior art package structure.

Referring to FIG. 1A, a die 110 is mounted over a printed circuit board (PCB) 100. The PCB 100 and the die 110 have square shapes. The PCB 100 has two pairs of parallel edges 101 and 103. The die 110 has two pairs of parallel edges 111 and 113. A plurality of bumps (not shown) are formed over the die 110 for connecting with other die or substrate (not shown). The edges 111 and 113 are parallel to the edges 101 and 103, respectively. In addition, corners 105 of the PCB 100 are aligned with corners 115 of the die 110 along the diagonal direction b1.

By using the package structure shown in FIG. 1A, circuits formed over the die 110 are electrically coupled to electrical routings defined over the PCB 100 via a plurality of bumps (not shown). Accordingly, signals generated from the circuits of the die 110 can be transmitted to the PCB 100 and then to another substrate or PCB (not shown) which is electrically coupled to the PCB 100. However, it is found that the bumps (not shown) formed between the die 110 and the substrate 100 are vulnerable to delamination during reliability tests and may be detached from the package structure during and/or after the reliability tests. The detachment of bumps is generally referred to as "white bumps."

Figure 1B:
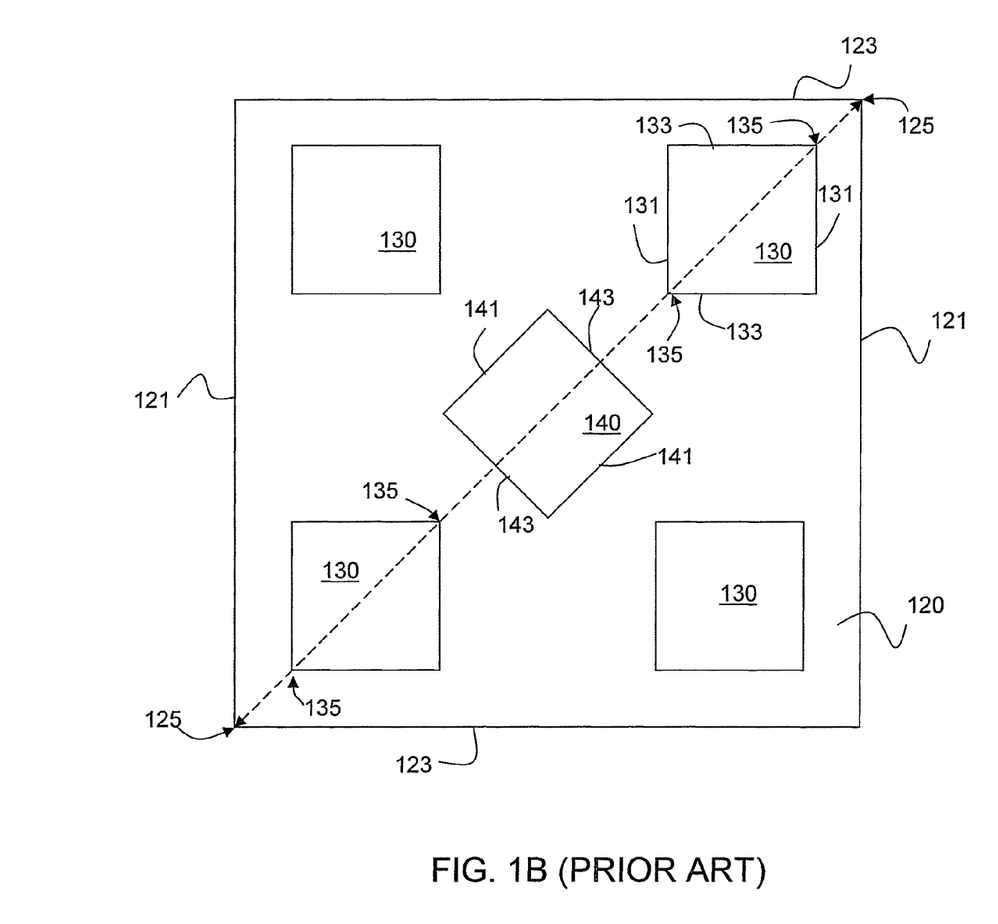

FIG. 1B is a top view of another prior art package structure.

Referring to FIG. 1B, static random access memories (SRAMs) 130 are mounted at corner regions of a printed circuit board (PCB) 120. A central processing unit (CPU) 140 is mounted at the central region of the PCB 120. The PCB 120, the SRAMs 130 and the CPU 140 have square shapes. The PCB 120 has two pairs of parallel edges 121 and 123. The SRAMs 130 and the CPU 140 have two pairs of parallel edges 131, 133 and 141, 143, respectively. A plurality of bumps (not shown) are formed between the SRAMs 130 and the PCB 120, and between the CPU 140 and the PCB 120 for connecting with another die or substrate (not shown). The edges 131 and 133 are parallel to the edges 121 and 123, respectively. In addition, corners 125 of the PCB 120 are aligned with corners 135 of the die 130 along the diagonal direction.

By the package structure shown in FIG. 1B, circuits formed over the SRAMs 130 and the CPU 140 are electrically coupled to routings defined over the PCB 120. In other words, signals generated from the circuits of the SRAMs 130 and the CPU 140 can be transmitted to the PCB 120 and then to another substrate or PCB (not shown) which is electrically coupled to the PCB 120. The package structure, in which the CPU 140 is rotated and disposed at the center of the PCB 120 has a dimension smaller than that of a structure in which a CPU has edges parallel to edges of the SRAMs 130. However, it is found that the bumps (not shown) formed between the SRAMs 130 and the PCB 120, and/or between the CPU 140 and the PCB 120 are vulnerable to delamination during reliability tests and may be detached from the package structure.

From the foregoing, new package structures are desired.

SUMMARY OF THE INVENTION

In accordance with some exemplary embodiments, a package structure comprises a substrate, a first die and at least one second die. The substrate includes a first pair of parallel edges and a second pair of parallel edges. The first die is mounted over the substrate. The first die includes a third pair of parallel edges and a fourth pair of parallel edges, wherein the third pair of parallel edges and the fourth pair of parallel edges are not parallel to the first pair of parallel edges and the second pair of parallel edges, respectively. The at least one second die is mounted over the first die.

The above and other features will be better understood from the following detailed description of the preferred embodiments of the invention that is provided in connection with the accompanying drawings.

BRIEF DESCRIPTION OF THE DRAWINGS

Following are brief descriptions of exemplary drawings. They are mere exemplary embodiments and the scope of the present invention should not be limited thereto.

DESCRIPTION OF THE PREFERRED EMBODIMENT

This description of the exemplary embodiments is intended to be read in connection with the accompanying drawings, which are to be considered part of the entire written description. In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

Figure 2A:
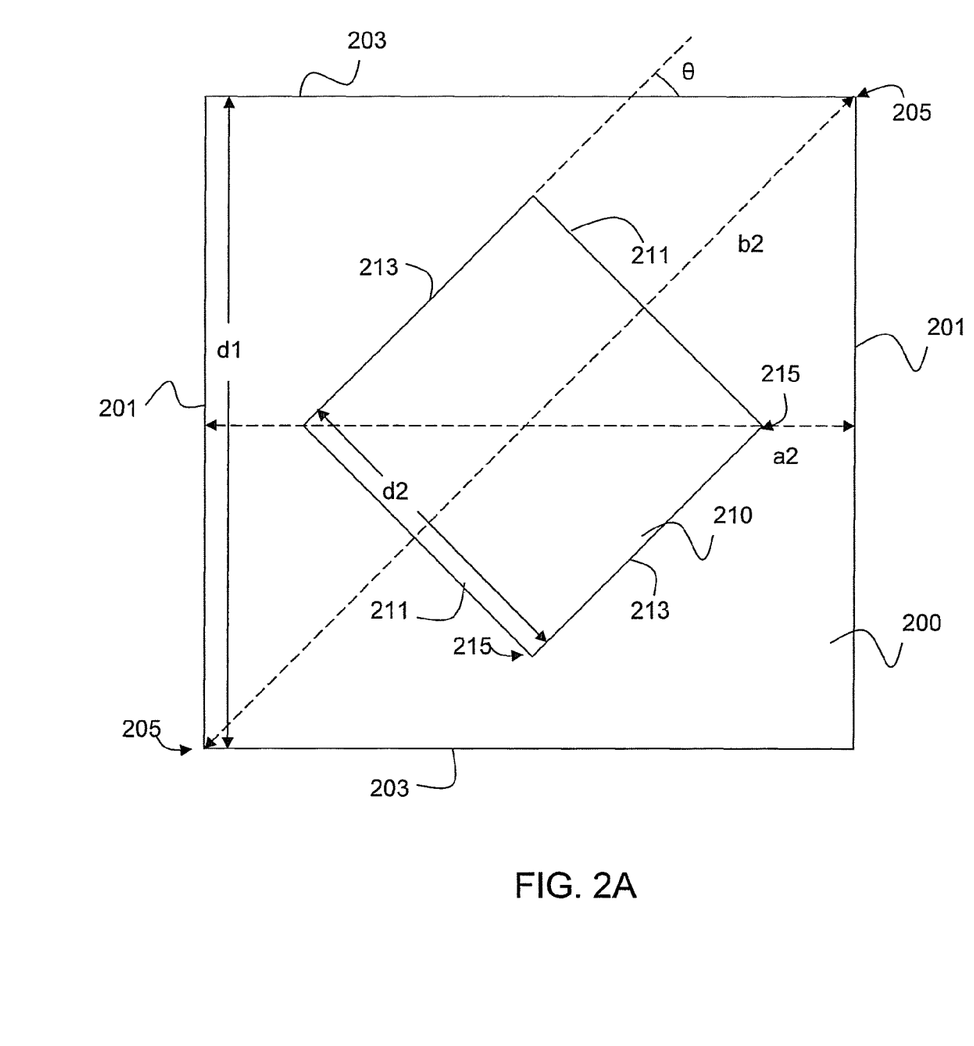
FIG. 2A is a schematic top view of an exemplary package structure.

FIG. 2A is a schematic top view of an exemplary package structure.

Referring to FIG. 2A, a single die 210 is mounted over a substrate 200. The substrate 200 may comprise two pairs of parallel edges 201 and 203. The single die 210 may comprise two pairs of parallel edges 211 and 213. The parallel edges 211 and 213 are not parallel to the parallel edges 201 and 203. The substrate 200 may comprise a plurality of corners 205 and the single die 210 may comprise a plurality of corners 215. In some embodiments, the corners 205 of the substrate 200 are not aligned with the corners 215 of the single die 210. That is, a diagonal passing through the corners 205 of substrate 200 does not pass through the corners 215 of the die 210.

The substrate 200 can be a printed circuit board (PCB), plastic substrate, ceramic substrate, silicon substrate, III-V compound substrate, display substrate such as a liquid crystal display (LCD), plasma display, electro luminescence (EL) lamp display, or light emitting diode (LED) substrate (collectively referred to as, substrate 200), for example. In some embodiments, the substrate 200 may comprise a plurality of ball grid arrays (BGAs) (not shown) disposed over the surface of the substrate 200 opposite to the surface over which the die 210 is mounted.

The single die 210 can be, for example, a silicon substrate, III-V compound substrate, display substrate such as a liquid crystal display (LCD), plasma display, electro luminescence (EL) lamp display, or light emitting diode (LED) substrate over which a plurality of devices, diodes, transistors and/or circuits are formed. The single die 210 may be wire bonded and/or flip-chip mounted over the substrate 200. The package structure formed by a flip-chip process is generally referred to as a flip-chip ball grid array (FCBGA) package. In other words, the FCBGA package includes a plurality of bumps (not shown) between the substrate 200 and the single die 210. In some embodiments, the substrate 200 and the die 210 have different thermal expansion coefficients from each other.

Figure 2B:
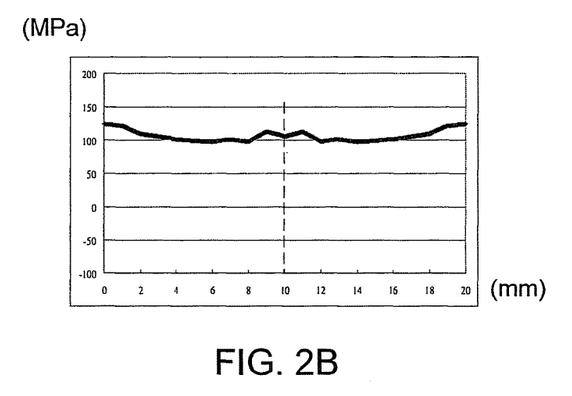
FIGS. 2B and 2D are simulation results regarding stresses of the die 110 mounted over the traditional package structure shown in FIG. 1 along directions a1 and b1.
Figure 2C:
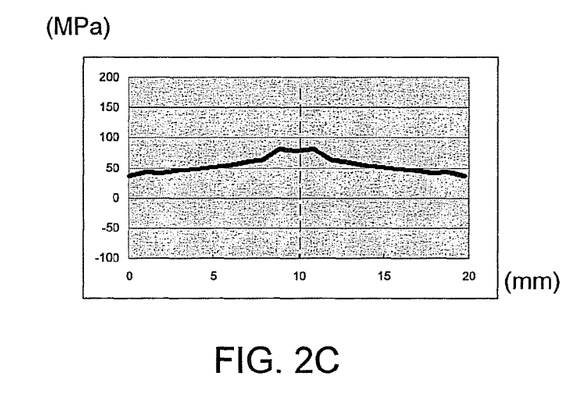
FIGS. 2C and 2E are simulation results regarding stresses of the die 210 mounted over the exemplary package structure shown in FIG. 2A along directions a2 and b2, respectively.
Figure 2D:
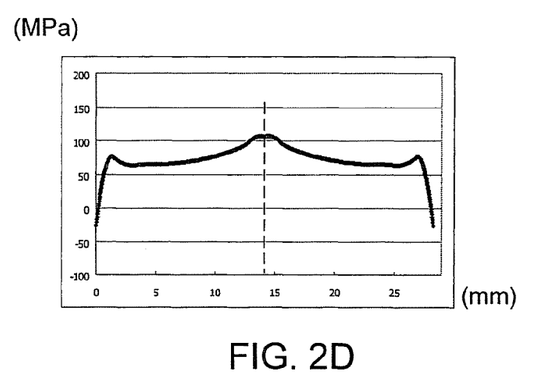
Figure 2E:
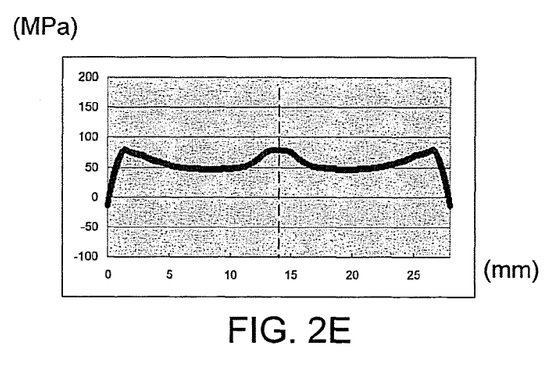

FIGS. 2B and 2D are simulation results regarding stresses of the die 110 mounted over the traditional package structure as shown in FIG. 1 along directions a1 and b1, and FIGS. 2C and 2E are simulation results regarding stresses of the die 210 mounted over the exemplary package structure shown in FIG. 2A along directions a2 and b2, respectively.

It is found that due to the difference of coefficients of thermal expansion (CTE) of the substrate 200 and the die 210, the die 210 and the substrate 200 are subjected to different stresses (e.g., expansion vs. compression) after the die 210 is mounted over the substrate 200.

Referring to FIGS. 2B and 2C, the die 110 mounted over the substrate 100 is subjected to a maximum stress of about 124 MPa at the edge 111 in the direction a1. The die 210 mounted over the substrate 200 is subjected to a maximum stress of about 81.5 MPa at the central region of the die 210 in the direction b2. Also as shown in FIGS. 2C and 2E, the die 110 is subjected to a maximum stress of about 107 MPa at the central region of the die 110 in the direction b1, and the die 210 is subjected to a maximum stress of about 80.3 MPa at the regions near to the corners 215 and the central region in the direction a2.

Based on the simulation results, it is preferred that the edges 211 and 213 of the die 210 are not parallel to the edges 201 and 203 of the substrate 200. In addition, it is preferred that the corners 215 of the die 210 are not aligned with the corners 205 of the substrate 200 in diagonal direction. By the disposition of the die 210 over the substrate 200 in a non-aligned configuration, as shown in FIG. 2A, stresses at the centers, edges 211, 213 and/or corners 215 of the die 210 can be desirably reduced.

In some embodiments, a dimension d1 of at least one of the pairs of parallel edges 201 and 203 of the substrate 200 is about 42 millimeters (mm) or more and a dimension d2 of at least one of the pairs of parallel edges 211 and 213 of the die 210 is about 20 mm or more. In other embodiments, the substrate 200 has a size of about 42×42 mm$^2$ and the die has a die size of about 20×20 mm$^2$. In still other embodiments, at least one of the substrate 200 and the die 210 has a rectangular shape. It will be understood that in the case where one of the substrate and the die has a square shape and the other of the substrate and the die has a non-square, rectangular shape, the die and the substrate are considered aligned if the edges of the die are parallel to respective edges of the substrate, and are considered non-aligned if none of the edges of the die are parallel to the edges of the substrate.

In some embodiments, one of the parallel edges 201 and 203 of the substrate 200 and one of the parallel edges 211 and 213 of the die 210 form an angle θ between about 15° and about 45° therebetween.

The single die 210 is mounted over the substrate 200 such that a desired area ratio of the single die 210 to the substrate 200 can be achieved. The desired area ratio can be about 0.1 or less such that a difference of CTE between the die 210 and the substrate 200 does not generate excessive stresses on the die 210 and/or the substrate 200. If a big die 210 is mounted over a small substrate 200, stresses of the die 210 will increase and may cause white bumps during and/or after reliability tests.

Figure 3:
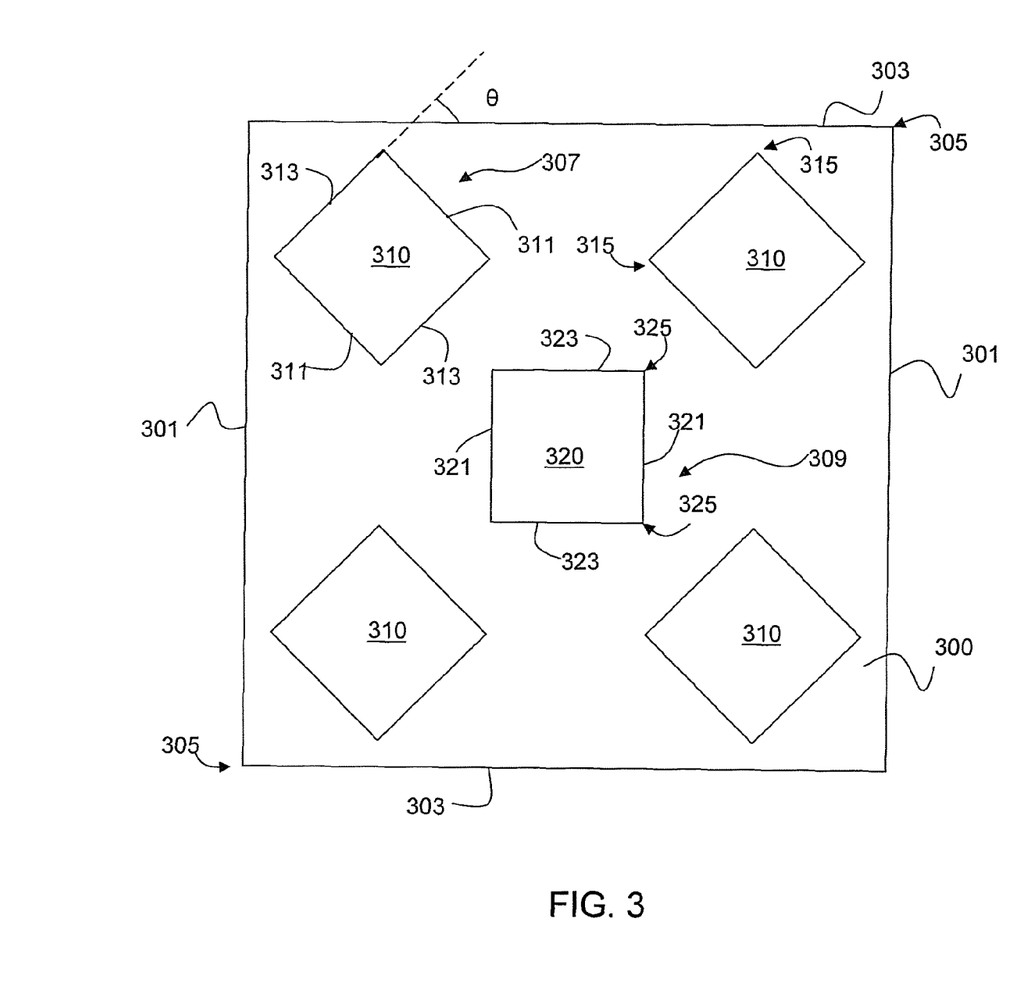
FIG. 3 is a top view showing another exemplary package structure.

FIG. 3 is a top view showing another exemplary package structure.

Referring to FIG. 3, a substrate 300 may comprise pairs of parallel edges 301 and 303, wherein the substrate 300 may comprise at least one corner region 307 and at least one central region 309. At least one die 320 is mounted at the central region 309 of the substrate 300. The die 320 may comprise pairs of parallel edges 321 and 323. At least one die 310 is mounted at the corner region 307 of the substrate 300. The die 310 may comprise pairs of parallel edges 311 and 313, wherein the parallel edges 311 and 313 of the die 310 are not parallel to the parallel edges 301 and 303 of the substrate 300, respectively. In addition, the die 310 may comprise a plurality of corners 315 and the substrate 300 may comprise a plurality of corners 305. In other embodiments, the corners 315 of the die 310 are not aligned with the corners 305 of the substrate 300.

The substrate 300 and the dies 310, 320 are similar to the substrate 200 and the die 210, respectively, set forth above in connection with FIG. 2A. It is found that the difference of coefficients of thermal expansion of the substrate 300 and the dies 310, 320 are more serious at the corner region 307 of the substrate 300 than at the central region 309 of the substrate 300. The disposition of the dies 310 whose pairs of parallel edges 311 and 313 are not parallel to the edges 301 and 303 of the substrate 300 can desirably reduce stresses of the dies 310 at the corner regions 307 of the substrate 300. In other embodiments, the disposition of the dies 310 such that the corners 315 of the dies 310 are not aligned with the corners 305 of the substrate 300 can desirably reduce the stresses of the dies 310, too.

In some embodiments, the edges 321, 323 of the die 320 are not parallel to the edges 301, 303 of the substrate 300, respectively, such that desired reduction in stresses of the die 320 can also be achieved. In other embodiments, the corners 325 of the die 320 are not aligned with the corners of the substrate 300 in the diagonal direction.

Figure 4A:
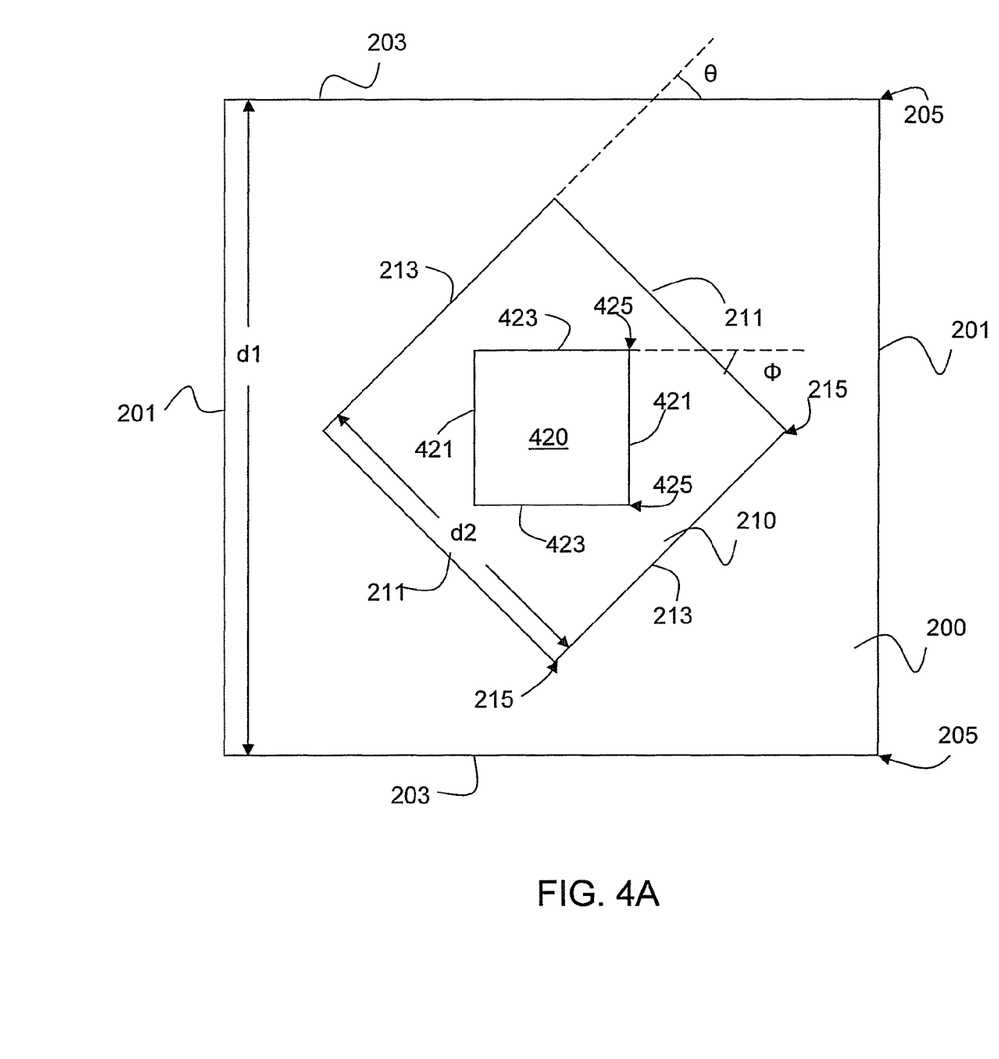
FIG. 4A is a top view showing an exemplary package structure.

FIG. 4A is a top view showing an exemplary package structure.

Referring to FIG. 4A, at least one die 420 is mounted over the die 210. The package structure shown in FIG. 4A is generally referred to as a stacked-module package (SMP).

The die 420 may be similar to the die 210 set forth above in connection with FIG. 2A. The die 420 may comprise pairs of parallel edges 421 and 423. In some embodiments, the parallel edges 421 and 423 of the die 420 are not parallel to the parallel edges 211 and 213 of the die 210. Further, in some embodiments, one of the parallel edges 421, 423 of the die 420 and one of the parallel edges 211, 213 of the substrate 200 form an angle Φ between about 15° and about 45°.

In some embodiments, the corners 425 of the die 420 are not aligned with the corners 215 of the die 210. In other embodiments, the edges 421, 423 of the die 420 are parallel to the edges 201, 203 of the substrate 200, respectively. In still other embodiments, the corners 425 of the die 420 are aligned with the corners 205 of the substrate in the diagonal direction.

Figure 4B:
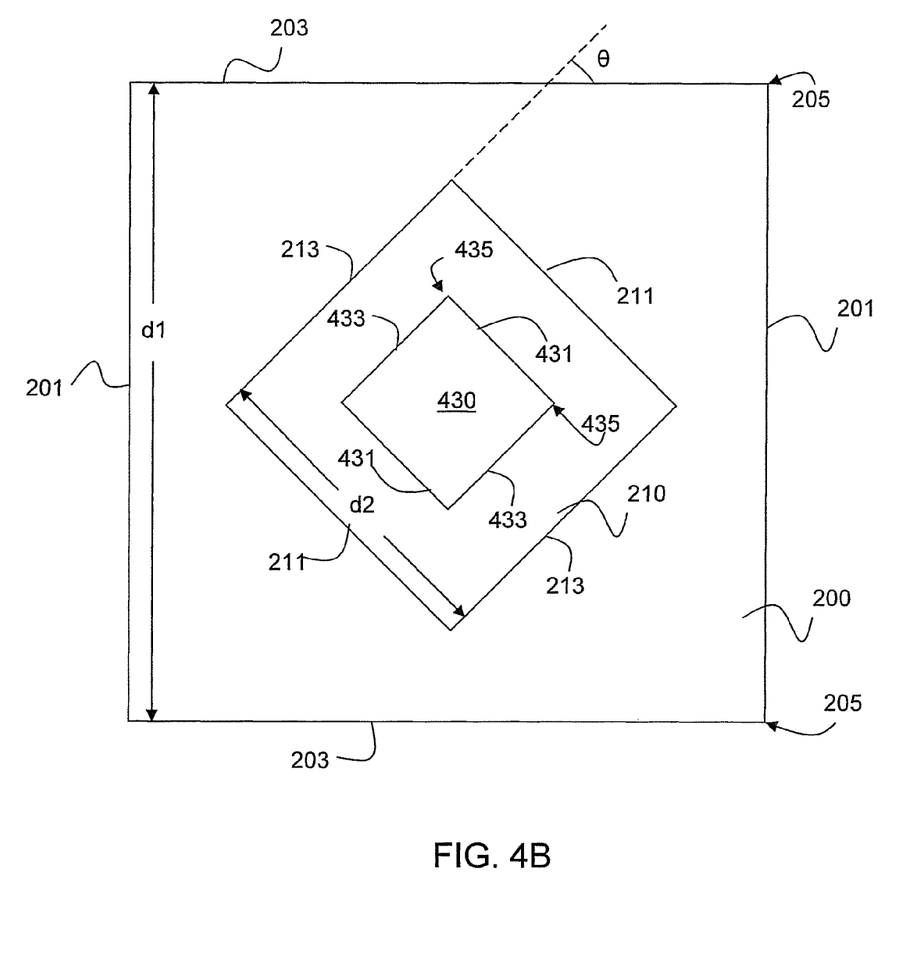
FIG. 4B is a top view showing another exemplary package structure.

FIG. 4B is a top view showing another exemplary package structure.

Referring to FIG. 4B, a die 430 is mounted over the die 210. The die 430 may be similar to the die 210 described above in connection with FIG. 2B. In the embodiment of FIG. 4B, the die 430 may comprise pairs of parallel edges 431 and 433, which are parallel to the parallel edges 211 and 213, respectively. In some embodiments, the corners 435 of the die 430 are not aligned with the corners 205 of the substrate 200. This disposition of the die 430 over the die 210 is desirable if stresses of the die 430 and/or 210 would not destroy the package structure during and/or after reliability tests.

Figure 4C:
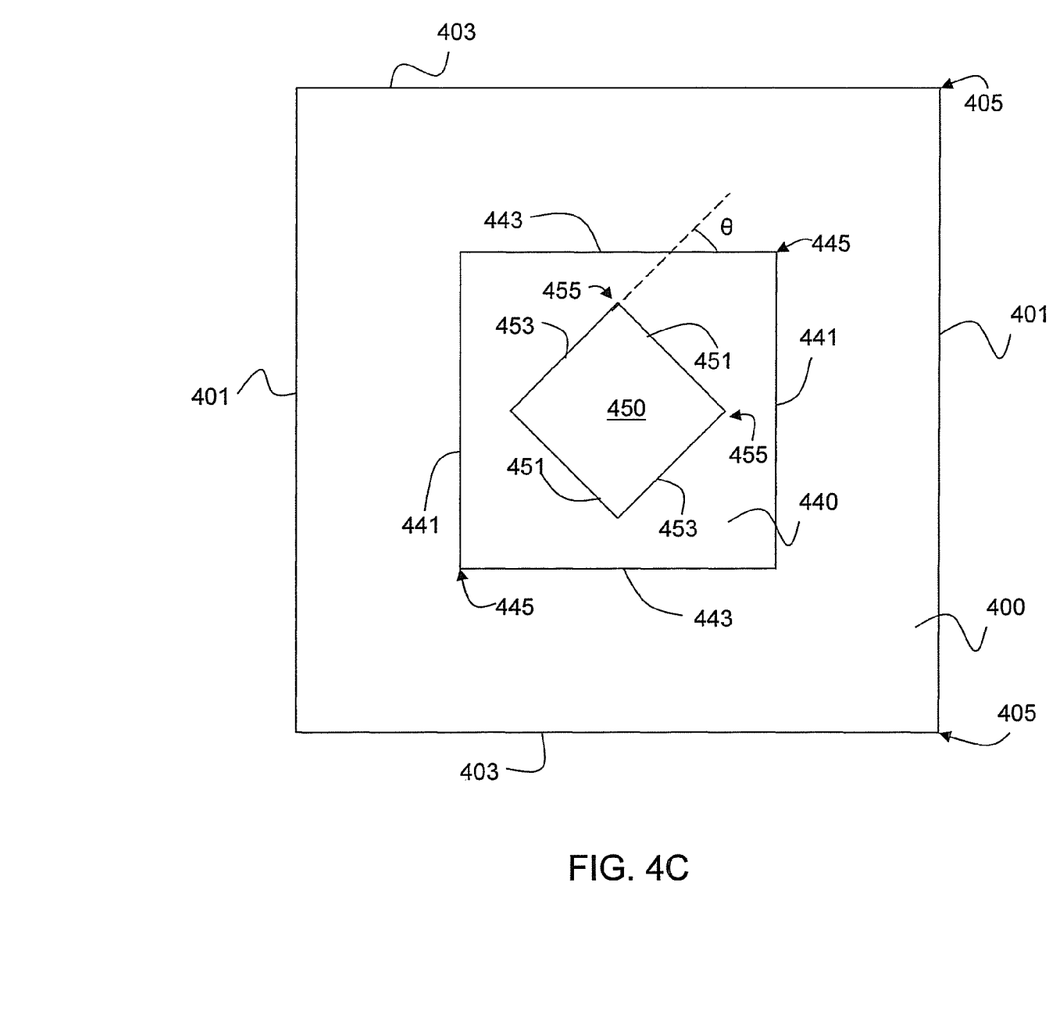
FIG. 4C is a top view showing an exemplary package structure.

FIG. 4C is a top view showing an exemplary package structure.

Referring to FIG. 4C, at least one die 440 is mounted over a substrate 400, and at least one die 450 is mounted over the die 440. The substrate 400 and dies 440 and 450 may be similar to the substrate 200 and the die 210, respectively, described above in connection with FIG. 2A. The substrate 400 may comprise pairs of parallel edges 401 and 403, the die 440 may comprise pairs of parallel edges 441 and 443, and the die 450 may comprise pairs of parallel edges 451 and 453. In some embodiments, the edges 451 and 453 are not parallel to the edges 441 and 443. In some embodiments, one of the parallel edges 451, 453 of the die 450 and one of the parallel edges 441, 443 of the die 440 form an angle θ between about 15° and about 45°. In some embodiments, the edges 441 and 443 of the die 440 are parallel to the edges 401 and 403 of the substrate 400, respectively, if stresses of the substrate 400 and the die 440 are desired.

In some embodiments, the edges 451, 453 of the die 450 are not parallel to the edges 401, 403 of the substrate 400, respectively. In some embodiments, the corners 455 of the die 450 are not aligned with the corners 405 of the substrate 400.

Although the present invention has been described in terms of exemplary embodiments, it is not limited thereto. Rather, the appended claims should be construed broadly to include other variants and embodiments of the invention which may be made by those skilled in the field of this art without departing from the scope and range of equivalents of the invention.

What is claimed is:

1. A package structure, comprising:
a substrate comprising a first pair of parallel edges and a second pair of parallel edges, wherein the substrate comprises at least one corner region and at least one central region; and
at least one first die mounted at the central region of the substrate, the first die comprising a third pair of parallel edges and a fourth pair of parallel edges; and
at least one second die mounted at the corner region of the substrate, the second die comprising a fifth pair of parallel edges and a sixth pair of parallel edges, wherein the fifth pair of parallel edges and the sixth pair of parallel edges are not parallel to the first pair of parallel edges and the second pair of parallel edges, respectively.

2. The package structure of claim 1, wherein one of the fifth pair of parallel edges and the sixth pair of parallel edges and one of the first pair of parallel edges and the second pair of parallel edges are separated by an angle between about 15° and about 45°.

3. The package structure of claim 1, further comprising at least one third die mounted at a corner opposite the second die.

4. The package structure of claim 3, wherein the third die comprises a seventh pair of parallel edges and an eighth pair of parallel edges, and the seventh pair of parallel edges and the eighth pair of parallel edges are parallel to the fifth pair of parallel edges and the sixth pair of parallel edges, respectively.

5. The package structure of claim 4, wherein one of the seventh pair of parallel edges and the eighth pair of parallel edges and one of the third pair of parallel edges and the fourth pair of parallel edges are separated by an angle between about 15° and about 45°.

6. The package structure of claim 3, wherein the seventh pair of parallel edges and the eighth pair of parallel edges is not parallel to at least one of the first pair of parallel edges and the second pair of parallel edges.

7. The package structure of claim 1, wherein the substrate further comprises a plurality of first corners, the second die further comprises a plurality of second corners and the first corners are not aligned with the second corners.

8. The package structure of claim 1, wherein the at least one second die comprises a plurality of second dies, each second die mounted at a respective corner region of the substrate, each second die comprising two respective pairs of parallel edges extending in first and second directions, respectively, wherein the first and second directions of each of the plurality of second dies are not parallel to the first pair of parallel edges and the second pair of parallel edges, respectively.

9. The package structure of claim 8, wherein the at least one second die comprises four second dies, each second die mounted at a respective corner region of the substrate.

10. The package structure of claim 9, wherein each of the second dies is oriented at the same angle with respect to the substrate.

11. The package structure of claim 10, wherein each of the second dies is oriented at about a 45 degree angle with respect to the substrate.

12. The package structure of claim 1, wherein the substrate is a silicon substrate.

13. A package structure, comprising:
a substrate comprising a first pair of parallel edges and a second pair of parallel edges, wherein the substrate comprises at least first and second corner regions and at least one central region;
a first die mounted at the first corner region, the first die comprising a third pair of parallel edges and a fourth pair of parallel edges, wherein the third pair of parallel edges and the fourth pair of parallel edges are not parallel to the first pair of parallel edges or the second pair of parallel edges; and
a second die mounted at the second corner region, the second die comprising a fifth pair of parallel edges and a sixth pair of parallel edges, wherein the fifth pair of parallel edges and the sixth pair of parallel edges are not parallel to the first pair of parallel edges or the second pair of parallel edges a center die having a seventh pair of parallel edges and an eighth pair of parallel edges, wherein the seventh pair of parallel edges and the eighth pair of parallel edges are parallel to the first pair of parallel edges or the second pair of parallel edges, respectively.

14. The package structure of claim 13, wherein:
the substrate further comprises third and four corner regions;
a third die is mounted at the third corner region, the third die comprising a seventh pair of parallel edges and an eighth pair of parallel edges, wherein the seventh pair of parallel edges and the eighth pair of parallel edges are not parallel to the first pair of parallel edges or the second pair of parallel edges; and
a fourth die mounted at the fourth corner region, the fourth die comprising a ninth pair of parallel edges and a tenth pair of parallel edges, wherein the ninth pair of parallel edges and the tenth pair of parallel edges are not parallel to the first pair of parallel edges or the second pair of parallel edges.

15. The package structure of claim 14, wherein each of the first, second, third and fourth dies has its edges oriented at about 45 degrees with respect to respective edges of the substrate.

16. The package structure of claim 13, wherein the first die, the second die, and the center die are arranged along a diagonal of the substrate.

17. A package structure, comprising:
a substrate comprising a first pair of parallel edges and a second pair of parallel edges, wherein the substrate comprises at least first, second, third and fourth corner regions and at least one central region;
a first die mounted at the first corner region, the first die comprising a third pair of parallel edges and a fourth pair of parallel edges;
a second die mounted at the second corner region, the second die comprising a fifth pair of parallel edges and a sixth pair of parallel edges;
a third die is mounted at the third corner region, the third die comprising a seventh pair of parallel edges and an eighth pair of parallel edges; and
a fourth die mounted at the fourth corner region, the fourth die comprising a ninth pair of parallel edges and a tenth pair of parallel edges,
wherein the third, fifth, seventh and ninth pairs of parallel edges are oriented between about 15 degrees and about 45 degrees from the first pair of parallel edges; and
a center die having an 11th pair of parallel edges and a 12th pair of parallel edges, wherein the 11th and 12th pair of edges are parallel to the first and second pairs of edges.

18. The package structure of claim 17, wherein the substrate is a silicon substrate.

* * * * *